(12) United States Patent
Yoshihara et al.

(10) Patent No.: US 8,107,293 B2
(45) Date of Patent: *Jan. 31, 2012

(54) SEMICONDUCTOR MEMORY DEVICE

(75) Inventors: Masahiro Yoshihara, Yokohama (JP);
Toshiaki Edahiro, Yokohama (JP); Koji Hosono, Fujisawa (JP)

(73) Assignee: Kabushiki Kaisha Toshiba, Tokyo (JP)

(*) Notice: Subject to any disclaimer, the term of this patent is extended or adjusted under 35 U.S.C. 154(b) by 0 days.

This patent is subject to a terminal disclaimer.

(21) Appl. No.: 13/004,926

(22) Filed: Jan. 12, 2011

(65) Prior Publication Data

US 2011/0103152 A1    May 5, 2011

Related U.S. Application Data

(63) Continuation of application No. 12/480,260, filed on Mar. 20, 2009, now Pat. No. 7,881,120.

(30) Foreign Application Priority Data

Mar. 25, 2008 (JP) ................................. 2008-077102

(51) Int. Cl.
*G11C 16/06* (2006.01)

(52) U.S. Cl. .......... 365/185.11; 365/185.25; 365/189.05

(58) Field of Classification Search ............. 365/185.21, 365/185.25, 189.04, 189.05, 185.17, 185.23, 365/203, 205, 185.03
See application file for complete search history.

(56) References Cited

U.S. PATENT DOCUMENTS

| | | | |
|---|---|---|---|
| 7,239,551 B2 | 7/2007 | Cernea et al. | |
| 7,486,562 B2 * | 2/2009 | Ogawa et al. | 365/185.21 |
| 7,495,955 B2 | 2/2009 | Ido | |
| 7,518,925 B2 | 4/2009 | Kuramori | |
| 7,675,799 B2 | 3/2010 | Huber et al. | |
| 7,881,120 B2 * | 2/2011 | Yoshihara et al. | 365/185.21 |

FOREIGN PATENT DOCUMENTS

| | | |
|---|---|---|
| JP | 2000-195286 | 7/2000 |
| JP | 2005-63633 | 3/2005 |

* cited by examiner

*Primary Examiner* — Gene Auduong
(74) *Attorney, Agent, or Firm* — Oblon, Spivak, McClelland, Maier & Neustadt, L.L.P.

(57) ABSTRACT

A semiconductor memory device comprises a plurality of memory cells connected to a bit line; and a sense amplifier operative to sense the magnitude of cell current flowing via the bit line in a selected memory cell connected to the bit line to determine the value of data stored in the memory cell. The sense amplifier includes a first transistor for precharge operative to supply current in the bit line via a first and a second sense node, a second transistor for charge transfer interposed between the first and second sense nodes, and a third transistor for continuous current supply operative to supply current in the bit line not via the first and second sense nodes.

17 Claims, 7 Drawing Sheets

Waveforms on Bit Line

Waveforms on Node SEN

SEMICONDUCTOR MEMORY DEVICE

CROSS-REFERENCE TO RELATED APPLICATION

This application is a continuation of and claims the benefit under 35 U.S.C. §120 from U.S. application Ser. No. 12/408,260, filed Mar. 20, 2009, which claims priority under 35 U.S.C. §119 from Japanese Patent Application No. 2008-77102, filed on Mar. 25, 2008, the entire contents of each of which are incorporated herein by reference.

BACKGROUND OF THE INVENTION

1. Field of the Invention

The present invention relates to a semiconductor memory device such as NAND-cell, NOR-cell, DINOR (Divided bit line NOR)-cell and AND-cell type EEPROMs, and more particularly to a semiconductor memory device including an improved sense amplifier of the current sense type.

2. Description of the Related Art

NAND-type flash memories have faced increases in use in handling massive data such as images and motion pictures in mobile devices and so forth and sharp rises in demand. A flash memory utilizes a multivalue technology that enables one memory cell to store 2-bit or more information, thereby storing a larger amount of information in a smaller chip area. The NAND-type has a NAND string structure of serially connected memory cells, which results in small cell current. Therefore, it is required to sense the small cell current accurately.

A sense amplifier in a semiconductor memory device such as the flash memory basically senses the presence/absence of or the magnitude of the cell current flowing in accordance with data in a memory cell to determine the value of the data. The sense amplifier is usually connected to a bit line (data line) connected to a plurality of memory cells, and the sense system is roughly divided into the voltage sense type and the current sense type.

The sense amplifier of the voltage sense type precharges a bit line isolated from the memory cells up to a certain voltage, then discharges the bit line through a selected memory cell, and senses the discharged state of the bit line at a sense node connected to the bit line. On sensing data, the bit line is isolated from the current source load to sense the bit line voltage determined by the cell data.

The sense amplifier of the current sense type, on the other hand, supplies a read current flowing in the memory cell via the bit line to sense data. Also in this case, the cell data determines the bit line voltage, and finally data determination at the sense node connected to the bit line is executed by sensing a difference in voltage on the sense node based on the difference in cell current.

The sense amplifier of the voltage sense type and the sense amplifier of the current sense type have the following advantages and disadvantages. The voltage sense type utilizes charging and discharging the bit line and accordingly requires less power consumption. In a massive memory having a larger bit line capacity, though, charging and discharging consumes time, which causes difficulty in fast sensing. In addition, the bit line voltage is changed with relatively large amplitude in accordance with cell data, which causes a problem associated with noises between adjacent bit lines.

The sense amplifier of the current sense type, to the contrary, supplies a read current flowing in the memory cell via the bit line to sense data, thereby achieving fast sensing. A clamp transistor (pre-sense amplifier) is arranged between the bit line and a sense node to suppress the amplitude of the bit line voltage, which therefore hardly causes a problem associated with noises between bit lines. Also in this case, bit lines are subjected to reading at intervals of one, and the bit lines not subjected to reading data are grounded and used as shield to preclude the mutual influence between bit lines on reading.

On the other hand, the bit line potential is always controlled and fixed at a constant voltage on sensing to preclude the mutual influence between adjacent bit lines to sense all bit lines in parallel as can be executed in a sense amplifier of the ABL (All Bit Line) type proposed (Patent document 1: JP 2006-500729T, paragraphs 0080-0088, FIG. 14).

The sense amplifier of the ABL type precharges an inner sense node and the bit line and then discharges the charge on the sense node to the bit line. When the potential on the sense node lowers to a certain value, current is supplied continuously in the bit line through a different path. The continuous current flowing in the bit line in this way fixes the potential on the bit line at a certain potential. The precharged voltage on the bit line and the variation in potential on the sense node vary depending on whether the memory cell connected to the bit line is an on-cell or an off-cell. Accordingly, by sensing the potential on the sense node, the data state in the memory cell can be read out.

In such the sense amplifier of the ABL type, on switching to the operation of releasing the charge precharged on the sense node to the bit line, the potential on the sense node lowers even if the selected cell connected to the bit line is an off-cell. Namely, when the selected cell connected to the bit line is an off-cell, the bit line can be charged completely by precharging ideally. Complete charging, however, consumes time and accordingly slight lack in charge may arise usually. Therefore, even if the selected cell is an off-cell, the sense node is discharged to the bit line to some extent on sensing. As a result, the difference in current between the on-cell and the off-cell decreases and the difference in potential appeared on the sense node also decreases, resulting in a reduction in sense margin.

SUMMARY OF THE INVENTION

In an aspect the present invention provides a semiconductor memory device, comprising: a plurality of memory cells connected to a bit line; and a sense amplifier operative to sense the magnitude of cell current flowing via the bit line in a selected memory cell connected to the bit line to determine the value of data stored in the memory cell. The sense amplifier includes a first transistor for precharge operative to supply current in the bit line via a first and a second sense node, a second transistor for charge transfer interposed between the first and second sense nodes, and a third transistor for continuous current supply operative to supply current in the bit line not via the first and second sense nodes.

In another aspect the present invention provides a semiconductor memory device, comprising: a plurality of memory cells connected to a bit line; and a sense amplifier operative to sense the magnitude of cell current flowing via the bit line in a selected memory cell connected to the bit line to determine the value of data stored in the memory cell. The sense amplifier includes a transistor for discrimination operative to discriminate data, a first sense node connected to the gate of the transistor for discrimination, and a second sense node operative to transfer charge to the bit line, wherein charge is transferred from the second sense node to the bit line, and then charge is selectively transferred from the first sense node to the second sense node in accordance with the voltage on the second sense node.

In yet another aspect the present invention provides a semiconductor memory device, comprising: a plurality of memory cells connected to a bit line; and a sense amplifier operative to sense the magnitude of cell current flowing via the bit line in a selected memory cell connected to the bit line to determine the value of data stored in the memory cell. The sense amplifier includes a first and a second sense node, wherein the sense amplifier, on sensing, precharges the first and second sense nodes and the bit line, transfers charge from the second sense node to the bit line, selectively transfers charge from the first sense node to the second sense node in accordance with the voltage on the second sense node after charge transfer, and discriminates data in the memory cell by the voltage on the first sense node.

DETAILED DESCRIPTION OF THE EMBODIMENTS

The embodiments of the invention will now be described with reference to the drawings.

Prior to the description of the present embodiment, the configuration of the prior art circuit is described as a reference example.

Reference Example

Figure 1:
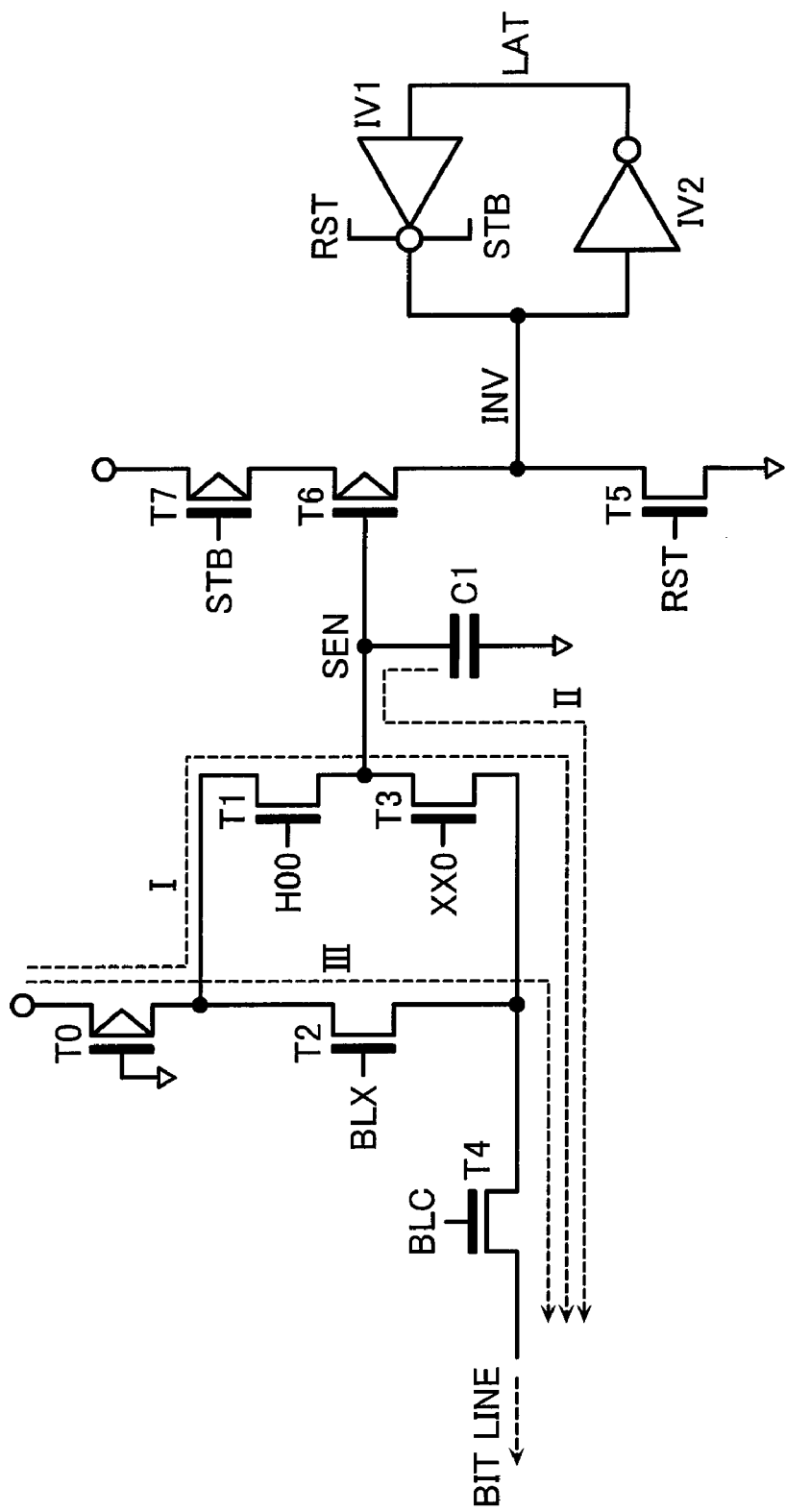
FIG. 1 is a circuit diagram of the major part of a sense amplifier in a NAND-type flash memory according to a reference example.

FIG. 1 is a circuit diagram of the major part of a sense amplifier of the ABL type of the prior art. This sense amplifier may be used as a read circuit in a NAND-type flash memory and connected to a bit line in a memory cell array.

Figure 2:
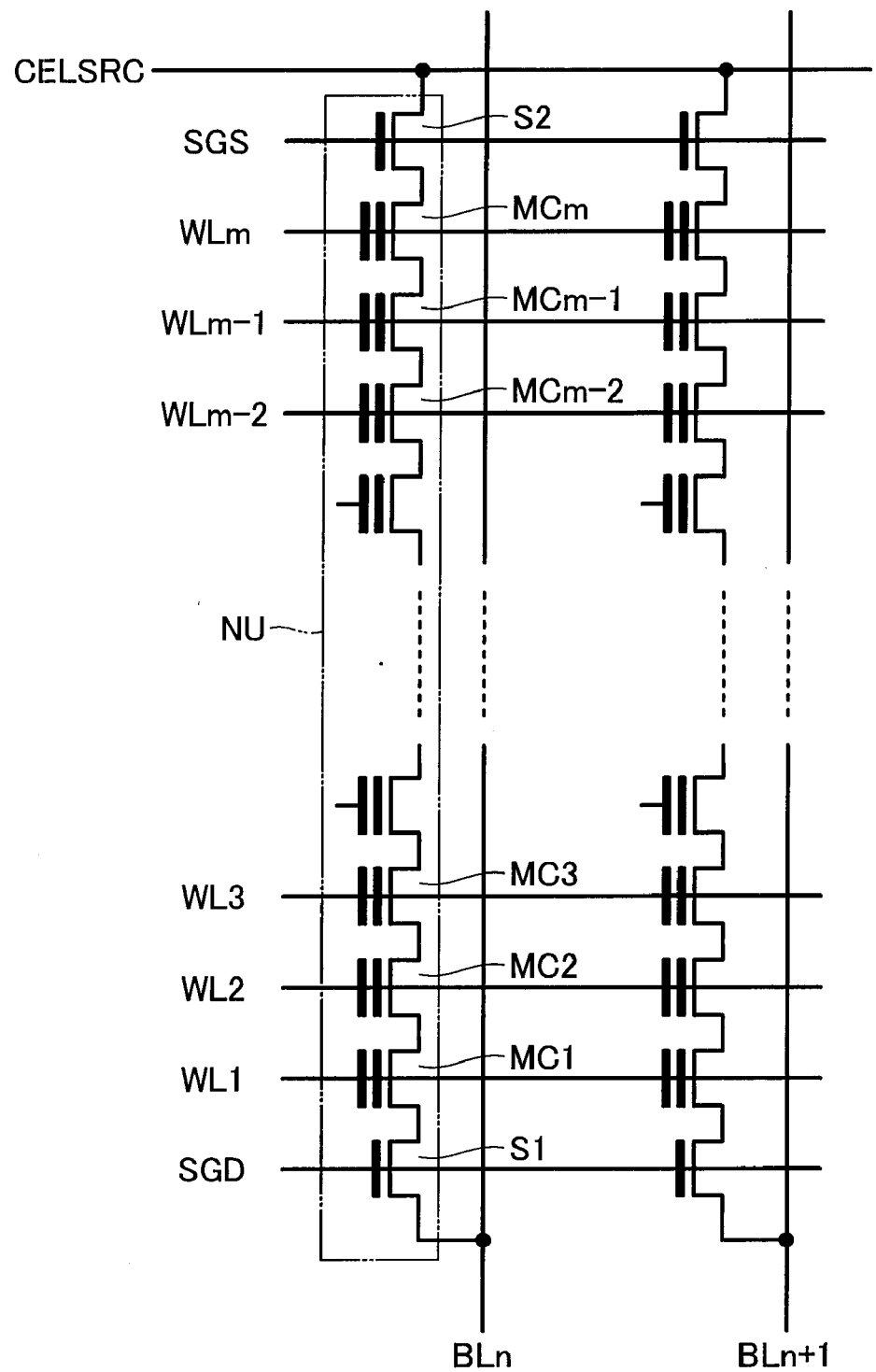
FIG. 2 is a circuit diagram showing a memory cell array connected to the sense amplifier.

The NAND-type flash memory may comprise plural NAND cell units NU arranged in matrix as shown in FIG. 2. A NAND cell unit NU includes a memory cell string of plural memory cells MC1-MCm serially connected such that adjacent cells share a source/drain diffused layer; a selection gate transistor S1 connected between one end of the memory cell string and a bit line BL; and a selection gate transistor S2 connected between the other end of the memory cell string and a source line CELSRC. The memory cells MC1-MCm have gates driven by word lines WL1-WLm and the selection gate transistors S1, S2 have gates driven by selection gates SGD, SGS.

The sense amplifier of the prior art is configured as shown in FIG. 1.

A sense node SEN is connected to a capacitor C1. An NMOS transistor T5 having a gate supplied with a reset signal RST resets an INV node of a data latch LAT. This circuit is used for sensing, which is described next.

A PMOS transistor T0 for current supply has a gate, which is turned to L level. If an NMOS transistor has a threshold of VthN, then a control voltage to an NMOS transistor T1 for precharge is set at H00=VDD+VthN, a control voltage to an NMOS transistor T2 for continuous current supply at BLX=0.7 V+VthN, a control voltage to an NMOS transistor T3 for charge transfer at XX0=0.9 V+VthN, and a control voltage to an NMOS transistor T4 for clamp at BLC=0.5 V+VthN. Thus, the sense node SEN can be charged up to VDD.

With the control voltage BLX=0.7 V+VthN, the control voltage XX0=0.9 V+VthN, and the control voltage BLC=0.5 V+VthN, the bit line BL can be charged up to around 0.5 V in voltage at the maximum, that is, the steady state.

Figure 3A:
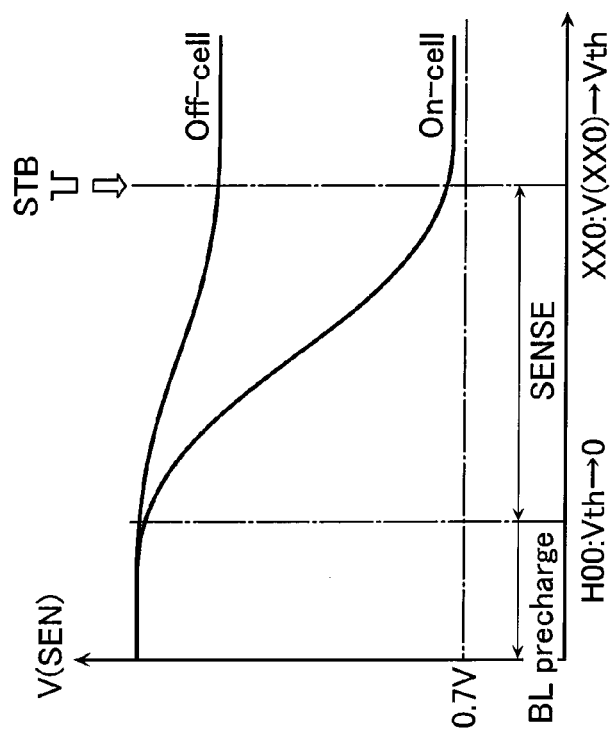
FIG. 3A is a waveform diagram showing bit line waveforms on precharging by the sense amplifier.

Voltage waveforms of the bit line BL on precharging are shown in FIG. 3A. When the selected memory cell is an off-cell, no current flows basically in the bit line BL and accordingly the bit line voltage is charged up to the maximum or 0.5 V. When the selected memory cell is an on-cell, cell current flows in the bit line BL. Accordingly, the current flowing in the memory cell and the current supplied from the sense amplifier match with each other and reach the steady state, and the voltage on the bit line becomes a middle voltage between 0.5 V and 0 V. In this state, the current flows in the bit line BL through a current path, which is shown by I in FIG. 1. When the bit line voltage reaches the steady state, the control signal H00=0 V is established to stop charging the capacitor C1 on the sense node SEN.

Figure 3B:
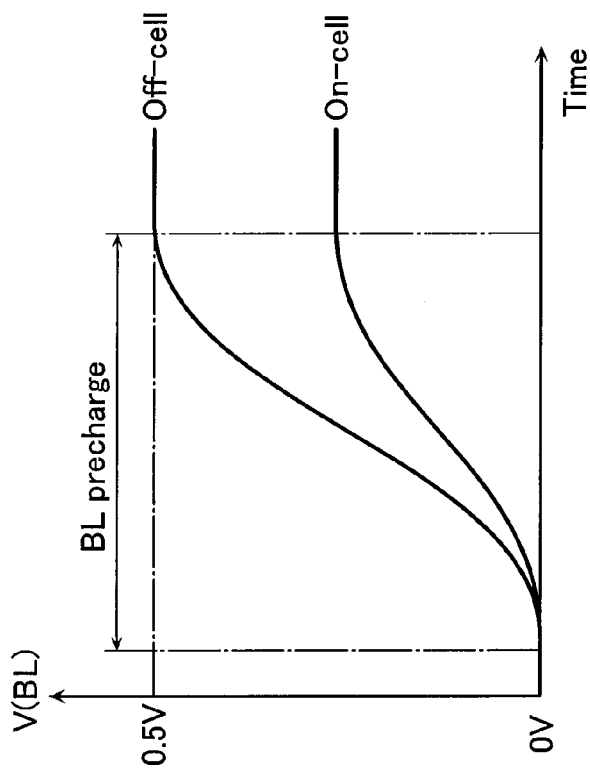
FIG. 3B is a waveform diagram showing sense node waveforms on sensing by the sense amplifier.

As a result, current flows in the bit line BL through another current path, which is shown by II in FIG. 1. As the voltage levels have a relation of XX0>BLX, charge is transferred from the capacitor C1 on the sense node SEN to the bit line BL preferentially. In accordance with the cell current, the voltage on the sense node SEN varies. The state of the variation is shown in FIG. 3B. When the level of the sense node SEN lowers and reaches 0.7 V, the control voltage BLX=0.7 V+VthN is still retained and accordingly current is supplied to the bit line via the transistor T2 thereafter. In this case, the current flows in the bit line BL through a current path, which is shown by III in FIG. 1. Thus, the level of the bit line BL can be held.

After certain time elapsed, the voltage level on the sense node SEN reaches a level determined by the cell current. Accordingly, this is discriminated by a discriminator including transistors T5-T7 and latched at a data latch LAT.

In the case of this sense amplifier, as shown in FIG. 3B, on switching to the operation of releasing the charge precharged on the sense node to the bit line BL, the potential on the sense node lowers even if the selected cell connected to the bit line BL is an off-cell for the reason as described earlier. Namely, completely charging the bit line BL consumes time and accordingly slight lack in charge may arise usually. Therefore, even if the selected cell is an off-cell, the sense node SEN is discharged to the bit line to some extent on sensing.

The following description is therefore given to a sense amplifier according to a first embodiment of the present invention, which is intended to prevent such the reduction in sense margin.

First Embodiment

Figure 4:
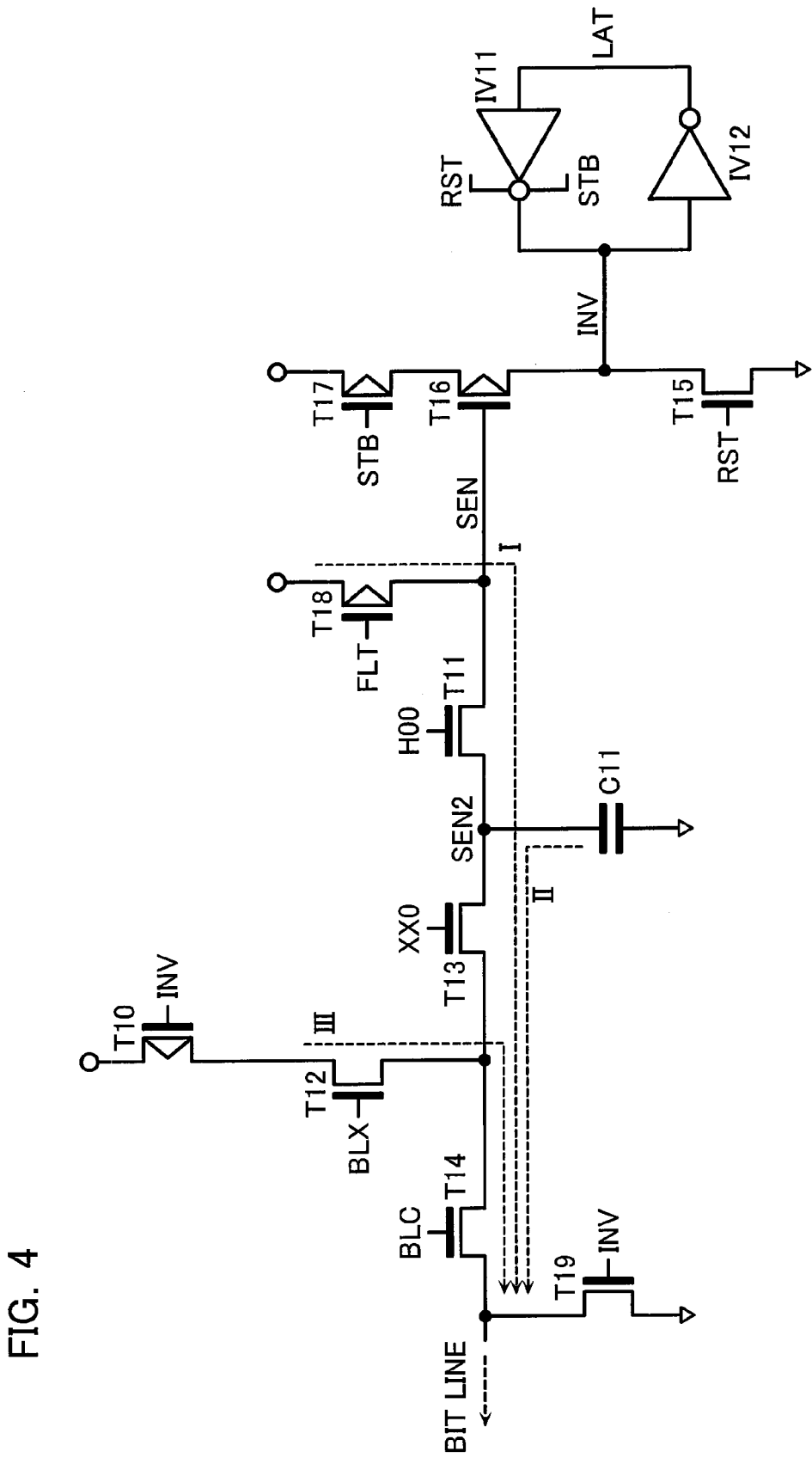
FIG. 4 is a circuit diagram of the major part of a sense amplifier in a NAND-type flash memory according to a first embodiment of the present invention.

FIG. 4 is a circuit diagram showing a configuration of a sense amplifier of the ABL type according to the first embodiment. This sense amplifier differs from the reference example shown in FIG. 1 in that one sense node of the prior art is divided into two: a first sense node SEN and a second sense node SEN2, and a transistor T11 for charge transfer is provided between both sense nodes SEN, SEN2 in the present embodiment.

A PMOS transistor T18 (first transistor) is operative to supply current in the bit line BL via the first and second sense nodes SEN, SEN2 to precharge the sense nodes SEN, SEN2 and the bit line BL. Between the first and second sense nodes SEN, SEN2, an NMOS transistor T11 (second transistor) for charge transfer is interposed. The second sense node SEN2 is connected to a capacitor C11. Between the second sense node SEN2 and the output terminal close to the bit line BL, an NMOS transistor T13 (fourth transistor) and a transistor T14 for bit line clamp are serially connected. Between the power terminal and a connection point between both transistors T13, T14, a serial circuit of a PMOS transistor T10 and an NMOS transistor T12 (third transistor) is connected. The first sense node SEN is connected to the gate of a PMOS transistor T16 for discrimination. The transistor T16 is connected to a PMOS transistor T17 on the power source side and to an NMOS transistor T15 on the ground side. The connection point between the transistors T15, T16 is connected to the INV node of the data latch LAT including inverters IV11, IV12. Between the output terminal close to the bit line and the ground terminal, an NMOS transistor T19 for reset is connected.

The sense amplifier thus configured executes sensing over three roughly divided periods.

The first period is a precharge period during which current flows through the current path I in the figure. The transistors T18, T11 are turned on to precharge the sense nodes SEN, SEN2 and then the transistors T13, T14 are turned on to precharge the bit line BL.

The second period is a charge transfer period during which current flows through the current path II in the figure. The transistors T18, T11 are turned off to transfer charge from the second sense node SEN2 to the bit line BL and then a certain sense voltage, $V_{SENSE}$+VthN, is applied to the gate of the transistor T11 to selectively transfer charge from the first sense node SEN to the second sense node SEN2.

In the third period, the transistor T12 is turned on to continue current supply to the bit line BL.

Figure 5:
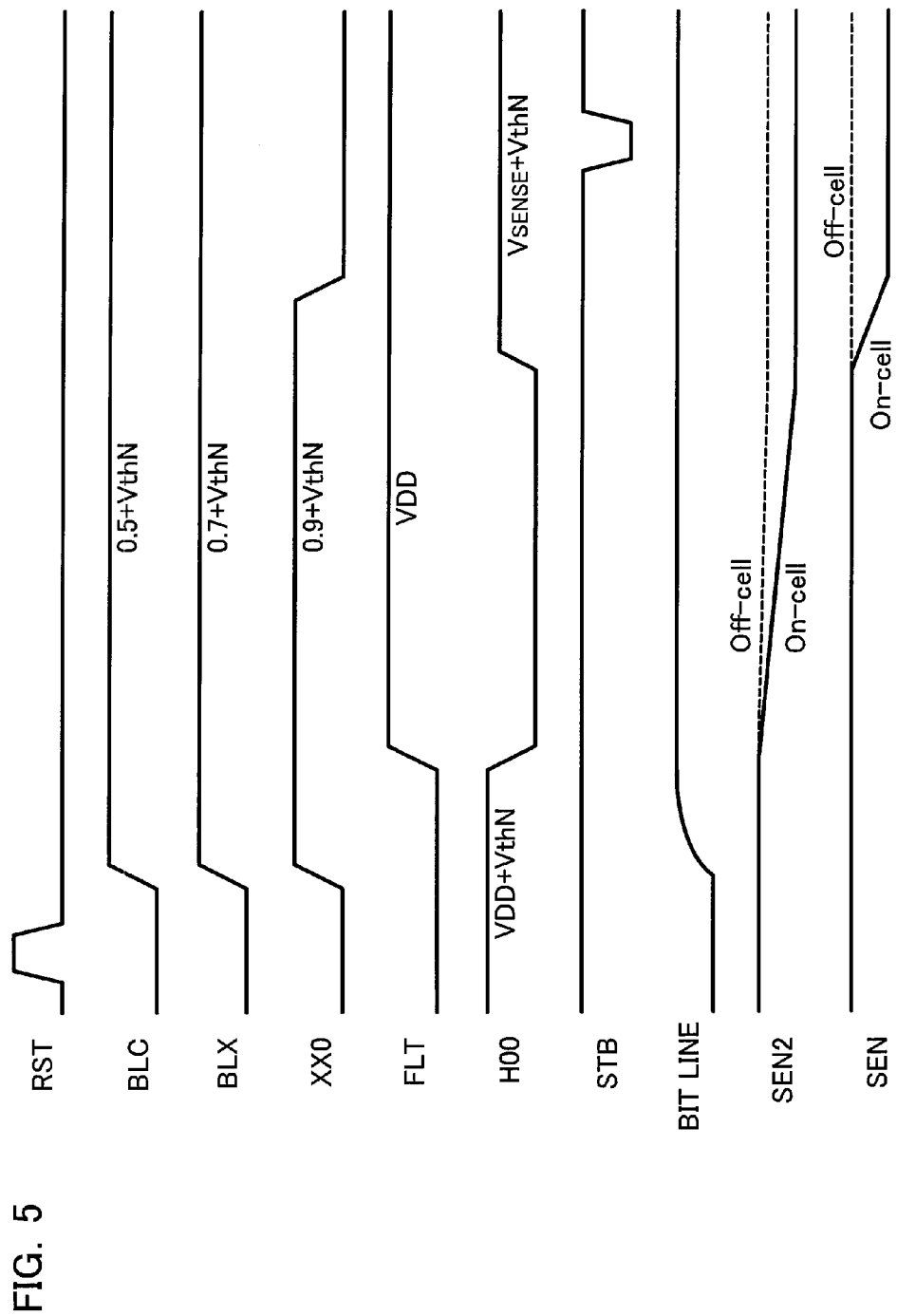
FIG. 5 is a waveform diagram of various control signals in the sense amplifier.

FIG. 5 is a waveform diagram of various control signals showing operation of the sense amplifier.

First, while the control signal FLT is kept at L level and the control signal H00 at VDD+VthN, the reset signal RST is used to reset the INV node of the latch circuit LAT. Next, the control signal BLC is changed to 0.5 V+VthN, the control signal BLX to 0.7V+VthN, the control signal XX0 to 0.9 V+VthN, and the control signal H00 to VDD+VthN to precharge the bit line BL via the transistors T18, T11, T13, T14 through the path shown by the dotted arrow I.

After the voltage on the bit line BL is charged up to around 0.5 V, sensing is started. First, the control signal FLT is raised up to VDD level, thereby cutting off the charge path to the first sense node SEN and the second sense node SEN2. At the same time, the control signal H00 is turned to 0 V, thereby switching the current path for current supplied to the bit line BL to the path II in the figure for discharging from the second sense node SEN2. In this case, the transistor T11 connected between the sense nodes SEN, SEN2 is turned off. Therefore, it is made possible to prevent the discharge of charge on the sense node SEN even if the discharge of charge on the sense node SEN2 occurs, thereby preventing the reduction in level on the sense node SEN.

Figure 6:
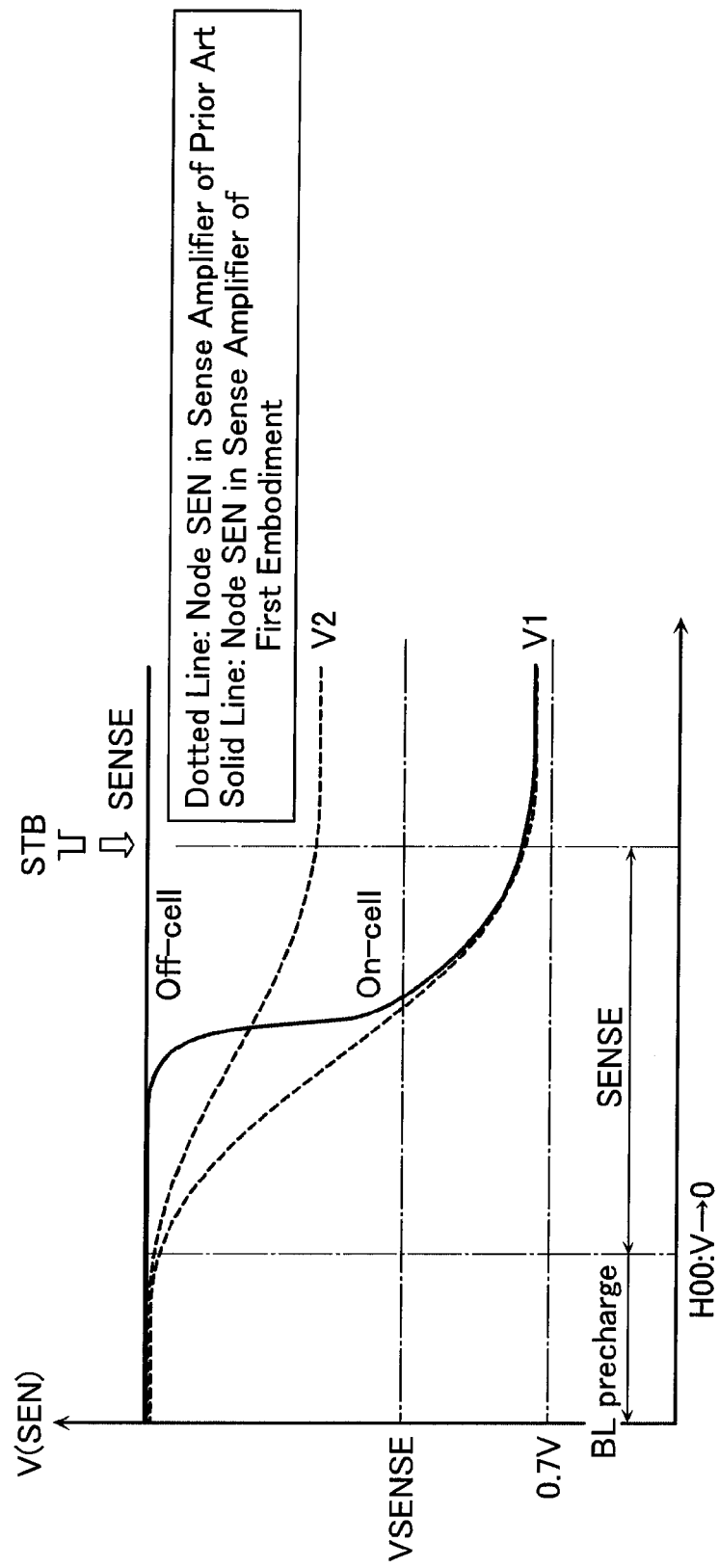
FIG. 6 is a waveform diagram showing sense node waveforms on sensing by the sense amplifier.

When current flows in the selected memory cell, the level on the second sense node SEN2 gradually reduces. When the memory cell is an off-cell, the degree of the reduction in level is smaller than when it is an on-cell. Therefore, after certain time elapsed, the control signal H00 is raised up to $V_{SENSE}$ (for example, 1 V)+VthN. If the selected memory cell is an on-cell, the second sense node SEN2 lowers below 1 V. Accordingly, the transistor T11 keeps the on-state and the charge on the first sense node SEN is transferred to the second sense node SEN2 as shown in FIG. 6. As a result, the first sense node SEN greatly lowers as shown in FIG. 6. In contrast, if the selected memory cell is an off-cell, the level on the second sense node SEN2 rises above 1 V. Accordingly, the transistor T11 keeps the off-state and the level on the first sense node SEN is kept at VDD as shown in FIG. 6.

In sensing, when charge is transferred from the first sense node SEN to the second sense node SEN2 (a current flow is supplied in the on-cell), the levels on the sense nodes SEN, SEN2 both lower. When the levels reach around 0.7 V, the current flowing in the transistor T13 decreases and the transistor T12 turns on to switch the current path for current flowing in the bit line BL to a path III in FIG. 4. Therefore, the level on the bit line BL does not change and can keep the steady state.

After certain time elapsed, the voltage level on the sense node SEN reaches the level determined by the cell current. The sense node SEN in the sense amplifier connected to the bit line BL with larger cell current lowers around 0.7 V and exceeds the threshold of the PMOS transistor T16 for discrimination of which gate is connected to the sense node SEN. Therefore, the INV node of the data latch LAT, which establishes the strobe signal STB=L level, is charged up to VDD and latched. The sense node SEN in the sense amplifier connected to the bit line BL with smaller cell current is at 0.7 V or higher and can not exceed the threshold of the PMOS transistor T16. In this case, even if the strobe signal STB=L level is established, the INV node is still kept at the ground level GND. Thus, data in the memory cell can be sensed. During sensing, current flows in the bit line BL via the sense node SEN or the transistor T12. Accordingly, it is possible to always supply the charge that is once discharged by the memory cell. Therefore, even though all bit lines BL are sensed at the same time, the voltage on the bit lines can keep the steady state and accordingly it is hardly susceptible to capacitive coupling from adjacent bit lines BL.

The present embodiment makes it possible to control the level of the control signal H00 (sense voltage) by a level of 0.9 V+VthN or higher, thereby controlling the level for executing charge transfer. With charge transfer, the level on the first sense node SEN reaches either VDD or the charge transfer level, which results in an improvement in sense margin. The improvement in sense margin means that the precharge time is short correspondingly and sensing can be executed even if a sufficient difference in current between the on-cell and the off-cell can not be ensured. Accordingly, it results in fast sensing.

As shown in FIG. 6, the sense voltage $V_{SENSE}$ applied to the gate of the transistor T11 may be set at a middle voltage between a first voltage V1, which converges after charge transfer from the second sense node SEN2 to the bit line BL when the selected memory cell is an on-cell, and a second voltage V2, which converges after charge transfer from the second sense node SEN2 to the bit line BL when the selected memory cell is an off-cell.

Second Embodiment

Figure 7:
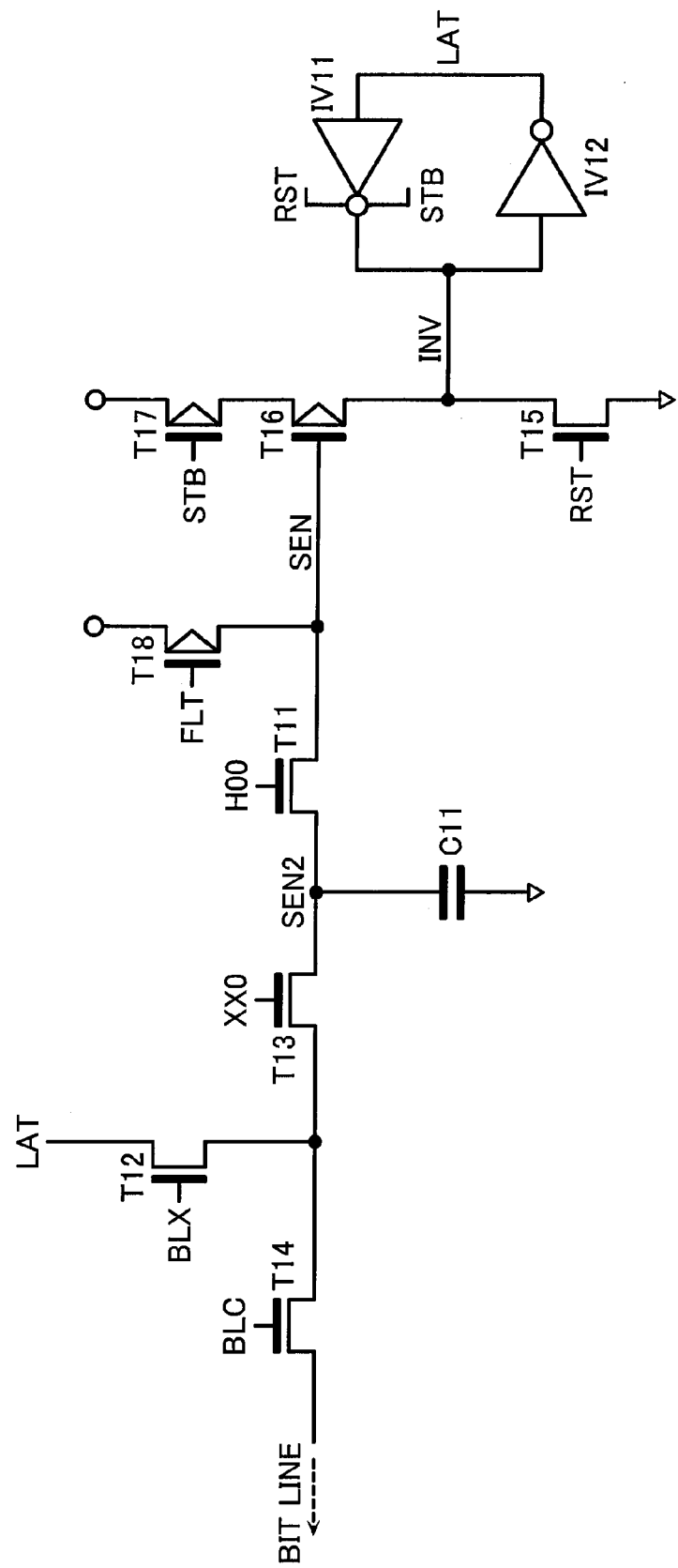
FIG. 7 is a circuit diagram of the major part of a sense amplifier in a NAND-type flash memory according to a second embodiment of the present invention.

FIG. 7 is a circuit diagram of a sense amplifier according to a second embodiment of the present invention. The same parts as those in FIG. 4 are denoted with the same reference numerals and omitted from the following detailed description.

This sense amplifier differs from the preceding embodiment in that the drain of the fourth transistor T12 is connected to the latch node LAT of the data latch LAT, and that the transistor T19 for reset located close to the bit line is omitted.

Also in this embodiment, sense margin can be enlarged similar to the first embodiment.

In the above embodiments, the sense amplifier in the NAND-type flash memory has been described by way of example though the present invention is not limited to the NAND-type flash memory but rather can be applied to other semiconductor memory devices such as NOR-type, DINOR (Divided bit line NOR)-type and AND-type EEPROMs.

What is claimed is:

1. A semiconductor memory device, comprising:
a memory cell connected to a bit line; and
a sense amplifier connected to said memory cell via said bit line, comprising,
a first transistor having one side connected to a power terminal side and another side connected to said bit line via first to third sense nodes,
a second transistor interposed between said first and second sense nodes, and
a third transistor having one side connected to said power terminal side and another side connected to said bit line via said third sense node, and
wherein a gate voltage of said second transistor is at an H level during a first period, and is increased to a predetermined sense level after being lowered to a L level during a second period after said first period.

2. The semiconductor memory device according to claim 1, wherein
a gate voltage of said first transistor is L level during said first period.

3. The semiconductor memory device according to claim 2, wherein
said gate voltage of said first transistor is increased to H level during said second period.

4. The semiconductor memory device according to claim 3, wherein
said gate voltage of said first transistor is retained at H level after said gate voltage of said second transistor is increased to said sense level during said second period.

5. The semiconductor memory device according to claim 4, wherein
said first transistor is a PMOS transistor, and
said second transistor is an NMOS transistor.

6. The semiconductor memory device according to claim 1, wherein
a gate voltage of said third transistor is increased to a predetermined voltage from L level.

7. The semiconductor memory device according to claim 4, wherein
a gate voltage of said third transistor is increased to a predetermined voltage from L level.

8. The semiconductor memory device according to claim 1, wherein
said sense amplifier comprises a fourth transistor interposed between said third sense node and said bit line, and
a gate voltage of said fourth transistor is increased to a predetermined voltage from L level during said first period, and retained at said predetermined voltage during said second period.

9. The semiconductor memory device according to claim 7, wherein
said sense amplifier comprises a fourth transistor interposed between said third sense node and said bit line, and
a gate voltage of said fourth transistor is increased to a predetermined voltage from L level during said first period, and retained at said predetermined voltage during said second period.

10. The semiconductor memory device according to claim 1, wherein
said sense amplifier comprises a fourth transistor interposed between said second and third sense nodes, and
a gate voltage of said fourth transistor is increased to a predetermined voltage from L level during said first period, and retained at said predetermined voltage during said second period.

11. The semiconductor memory device according to claim 9, wherein
said sense amplifier comprises a fifth transistor interposed between said second and third sense nodes, and
a gate voltage of said fifth transistor is increased to a predetermined voltage from L level during said first period, and retained at said predetermined voltage during said second period.

12. The semiconductor memory device according to claim 1, wherein
said first and second sense nodes are charged to a predetermined voltage during said first period.

13. The semiconductor memory device according to claim 12, wherein
when said memory cell is in an on-cell state, a voltage of said second sense node is reduced from said predetermined voltage during said second period.

14. The semiconductor memory device according to claim 13, wherein
when said memory cell is in an on-cell state, a voltage of said first sense node is retained at said predetermined voltage during said second period.

15. The semiconductor memory device according to claim 14, wherein
when said memory cell is in the on-cell state, said voltage of said first sense node is reduced from said predetermined voltage after said gate voltage of said second transistor is increased to said sense level during said second period.

16. The semiconductor memory device according to claim 1, wherein
said sense amplifier has a fourth transistor having a gate connected to said first sense node, and a fifth transistor connected to a source or a drain of said fourth transistor, and wherein
a gate voltage of the fifth transistor is reduced to L level from H level after said gate voltage of said second transistor is increased to said sense level during said second period.

17. The semiconductor memory device according to claim 15, wherein
said sense amplifier has a fourth transistor having a gate connected to said first sense node, and a fifth transistor connected to a source or a drain of said fourth transistor, and wherein
a gate voltage of the fifth transistor is reduced to L level from H level after said gate voltage of said second transistor is increased to said sense level during said second period.

* * * * *

UNITED STATES PATENT AND TRADEMARK OFFICE
CERTIFICATE OF CORRECTION

PATENT NO. : 8,107,293 B2
APPLICATION NO. : 13/004926
DATED : January 31, 2012
INVENTOR(S) : Masahiro Yoshihara et al.

Page 1 of 1

It is certified that error appears in the above-identified patent and that said Letters Patent is hereby corrected as shown below:

On the title page, Item (63), the Related U.S. Application Data information is incorrect. Item (63) should read:

-- Related U.S. Application Data

(63) Continuation of application No. 12/408,260, filed on Mar. 20, 2009, now Pat. No. 7,881,120 --

Signed and Sealed this
Twenty-seventh Day of March, 2012

David J. Kappos
*Director of the United States Patent and Trademark Office*